United States Patent
Lee et al.

(10) Patent No.: US 10,241,604 B2
(45) Date of Patent: Mar. 26, 2019

(54) TOUCH PANEL, METHOD OF MANUFACTURING THE SAME AND TOUCH PANEL INTEGRATED ORGANIC LIGHT EMITTING DISPLAY DEVICE

(71) Applicant: LG Display Co., Ltd., Seoul (KR)

(72) Inventors: Mi Jung Lee, Gyeonggi-do (KR); Yong Chul Kim, Gyeonggi-do (KR); Se Jong Yoo, Gyeonggi-do (KR); Jong Hyun Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 94 days.

(21) Appl. No.: 15/322,215

(22) PCT Filed: Aug. 20, 2015

(86) PCT No.: PCT/KR2015/008699
§ 371 (c)(1),
(2) Date: Dec. 27, 2016

(87) PCT Pub. No.: WO2016/072598
PCT Pub. Date: May 12, 2016

(65) Prior Publication Data
US 2017/0147116 A1    May 25, 2017

(30) Foreign Application Priority Data
Nov. 7, 2014 (KR) .......................... 10-2014-0154745

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *H01L 27/323* (2013.01);
(Continued)

(58) Field of Classification Search
CPC . G06F 2203/04103; G06F 2203/04111; G06F 2203/04112; G06F 3/0412; G06F 3/044
See application file for complete search history.

(56) References Cited

U.S. PATENT DOCUMENTS 8,310,460 B2 * 11/2012 Saitou ..................... G06F 3/044
178/18.01
8,502,802 B2 * 8/2013 Teramoto ................ G06F 3/044
345/174
(Continued)

OTHER PUBLICATIONS

International Search Report dated Nov. 27, 2015, for International Application No. PCT/KR2015/008699.

*Primary Examiner* — Michael J Jansen, II
(74) *Attorney, Agent, or Firm* — Morgan, Lewis & Bockius LLP

(57) ABSTRACT

Provided are a touch panel, a method of manufacturing the same, and a touch panel integrated organic light emitting display device. The touch panel includes a substrate, a plurality of connection electrodes, an over-coating layer, a first line electrode, a second line electrode, a plurality of first segment electrodes, and a plurality of second segment electrodes. The plurality of connection electrodes is disposed on the substrate to be separated from each other. The over-coating layer includes a plurality of contact holes exposing a part of each connection electrode. The second line electrode is connected with the connection electrode through the contact hole of the over-coating layer without disconnection.

18 Claims, 9 Drawing Sheets

(52) U.S. Cl.
CPC .............. *G06F 2203/04103* (2013.01); *G06F 2203/04111* (2013.01); *G06F 2203/04112* (2013.01)

(56) References Cited

U.S. PATENT DOCUMENTS

| | | | |
|---|---|---|---|
| 8,586,874 B2* | 11/2013 | Kuriki | G06F 3/044 174/261 |
| 8,593,413 B2* | 11/2013 | Chuang | G06F 3/044 345/173 |
| 8,686,308 B2* | 4/2014 | Kuriki | G06F 3/044 200/600 |
| 8,709,265 B2* | 4/2014 | Misaki | G02F 1/1333 216/20 |
| 8,717,332 B2* | 5/2014 | Kono | G06F 3/044 345/174 |
| 8,723,046 B2* | 5/2014 | Hashimoto | G06F 3/044 174/250 |
| 8,743,078 B2* | 6/2014 | Kim | G06F 3/044 345/174 |
| 8,747,959 B2* | 6/2014 | Krasnov | H01L 31/1884 427/255.19 |
| 8,766,105 B2* | 7/2014 | Kuriki | G06F 3/044 174/250 |
| 8,847,093 B2* | 9/2014 | Xie | G06F 3/044 200/600 |
| 9,030,438 B2* | 5/2015 | Cok | G06F 3/044 345/174 |
| 9,041,869 B2* | 5/2015 | Kim | G06F 3/0412 257/432 |
| 9,075,484 B2* | 7/2015 | Ritter | G06F 3/044 |
| 9,117,778 B2* | 8/2015 | Yanagawa | G06F 3/044 |
| 9,182,866 B2* | 11/2015 | Inagaki | G06F 3/0418 |
| 9,202,949 B2* | 12/2015 | Kim | H01L 31/0232 |
| 9,207,720 B2* | 12/2015 | Kang | G06F 1/1643 |
| 9,262,018 B2* | 2/2016 | Kim | G06F 3/044 |
| 9,285,842 B2* | 3/2016 | Yashiro | G06F 3/044 |
| 9,292,143 B2* | 3/2016 | Sugita | G06F 3/044 |
| 9,405,330 B2* | 8/2016 | Yamagishi | G06F 3/044 |
| 9,459,750 B2* | 10/2016 | Han | G06F 3/044 |
| 9,547,402 B2* | 1/2017 | An | H01L 51/5256 |
| 9,667,248 B2* | 5/2017 | Lim | H03K 17/96 |
| 9,671,886 B2* | 6/2017 | Yoo | G06F 3/0412 |
| 9,857,922 B2* | 1/2018 | Liu | G06F 3/044 |
| 9,891,764 B2* | 2/2018 | Song | G06F 3/044 |
| 9,891,775 B2* | 2/2018 | Yoo | G06F 3/044 |
| 9,898,053 B2* | 2/2018 | Lee | G06F 3/044 |
| 2010/0026661 A1 | 2/2010 | Teramoto | |
| 2010/0149116 A1* | 6/2010 | Yang | G06F 3/0416 345/173 |
| 2010/0182275 A1 | 7/2010 | Saitou | |
| 2010/0302201 A1* | 12/2010 | Ritter | G06F 3/044 345/174 |
| 2011/0012845 A1* | 1/2011 | Rothkopf | G06F 3/044 345/173 |
| 2011/0032209 A1 | 2/2011 | Kim | |
| 2011/0102370 A1* | 5/2011 | Kono | G06F 3/044 345/174 |
| 2011/0210935 A1* | 9/2011 | Chuang | G06F 3/0412 345/174 |
| 2011/0290631 A1* | 12/2011 | Kuriki | G06F 3/044 200/600 |
| 2012/0118614 A1* | 5/2012 | Kuriki | G06F 3/044 174/250 |
| 2012/0212449 A1* | 8/2012 | Kuriki | G06F 3/044 345/174 |
| 2012/0241408 A1* | 9/2012 | Misaki | G02F 1/1333 216/20 |
| 2012/0262385 A1* | 10/2012 | Kim | G06F 3/044 345/173 |
| 2013/0000954 A1* | 1/2013 | Hashimoto | G06F 3/044 174/250 |
| 2013/0004678 A1* | 1/2013 | Krasnov | H01L 31/1884 427/521 |
| 2013/0005139 A1* | 1/2013 | Krasnov | G02F 1/13439 438/652 |
| 2013/0044384 A1* | 2/2013 | Kim | B05D 5/06 359/885 |
| 2013/0063371 A1* | 3/2013 | Lee | G06F 3/044 345/173 |
| 2013/0098749 A1* | 4/2013 | Xie | G06F 3/044 200/600 |
| 2013/0256105 A1* | 10/2013 | Lim | H03K 17/96 200/275 |
| 2013/0258568 A1* | 10/2013 | Iwata | H01B 1/22 361/679.01 |
| 2013/0341651 A1* | 12/2013 | Kim | H01L 31/0232 257/84 |
| 2014/0049503 A1* | 2/2014 | Cok | G06F 3/044 345/174 |
| 2014/0070350 A1* | 3/2014 | Kim | G06F 3/044 257/432 |
| 2014/0139761 A1* | 5/2014 | Yanagawa | G06F 3/044 349/12 |
| 2014/0152910 A1* | 6/2014 | Kang | G06F 1/1643 349/12 |
| 2014/0152917 A1* | 6/2014 | Lee | G06F 3/044 349/12 |
| 2014/0152921 A1* | 6/2014 | Yashiro | G06F 3/044 349/12 |
| 2014/0160072 A1* | 6/2014 | Inagaki | G06F 3/0418 345/174 |
| 2014/0160377 A1* | 6/2014 | Yamagishi | G06F 3/044 349/12 |
| 2014/0182894 A1* | 7/2014 | Liu | G06F 3/044 174/251 |
| 2014/0198268 A1 | 7/2014 | Sugita et al. | |
| 2014/0346027 A1* | 11/2014 | Li | G06F 3/044 200/600 |
| 2015/0049260 A1* | 2/2015 | Yashiro | G06F 3/044 349/12 |
| 2015/0177884 A1* | 6/2015 | Han | G06F 3/044 345/174 |
| 2015/0185917 A1* | 7/2015 | Song | G06F 3/044 345/174 |
| 2015/0261370 A1* | 9/2015 | Yoo | G06F 3/0412 345/173 |
| 2016/0070406 A1* | 3/2016 | Han | G06F 3/044 345/173 |
| 2016/0103516 A1* | 4/2016 | An | H01L 51/5256 345/174 |
| 2017/0220157 A1* | 8/2017 | Yoo | G06F 3/044 |

* cited by examiner

[Fig. 3]
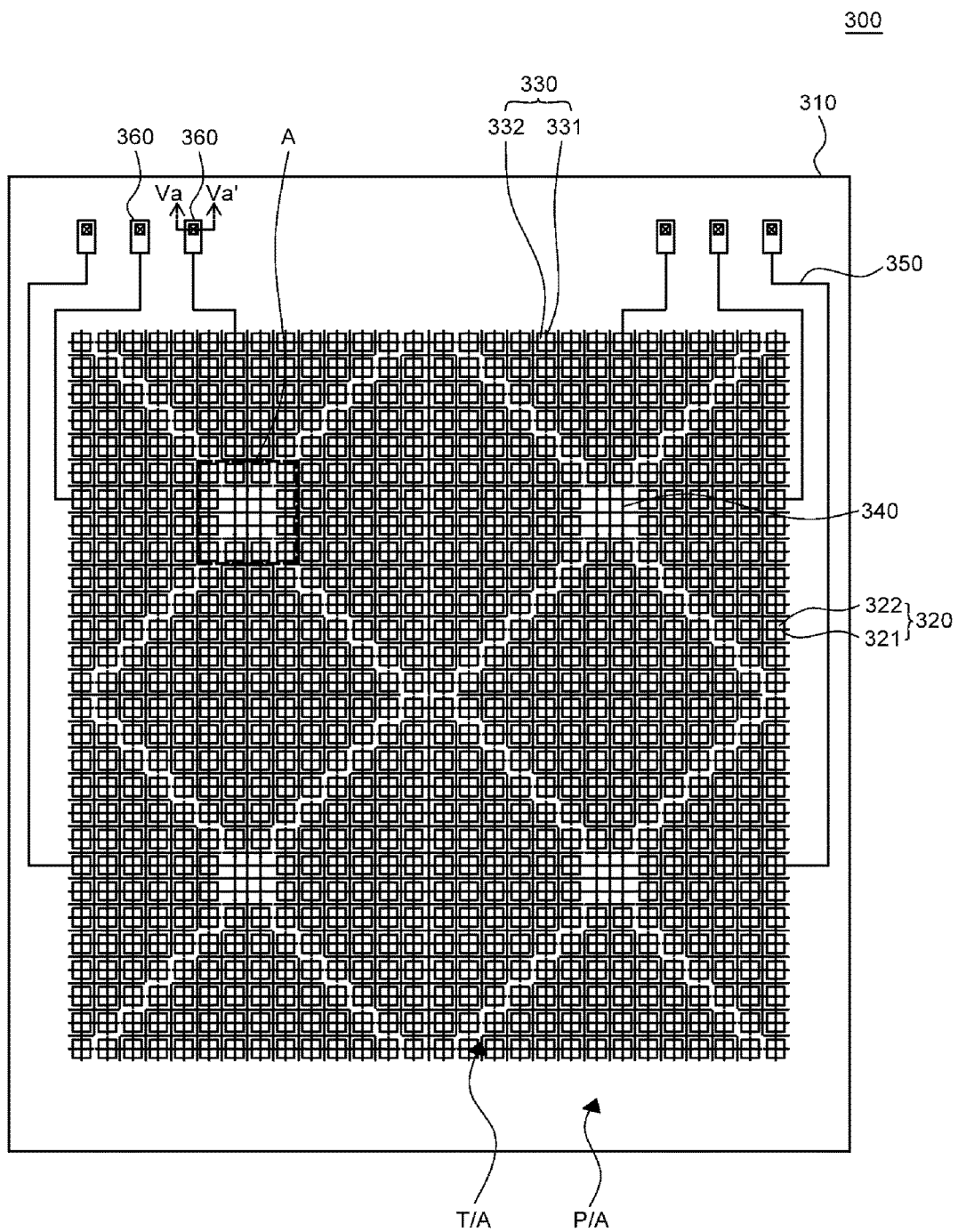

[Fig. 4]
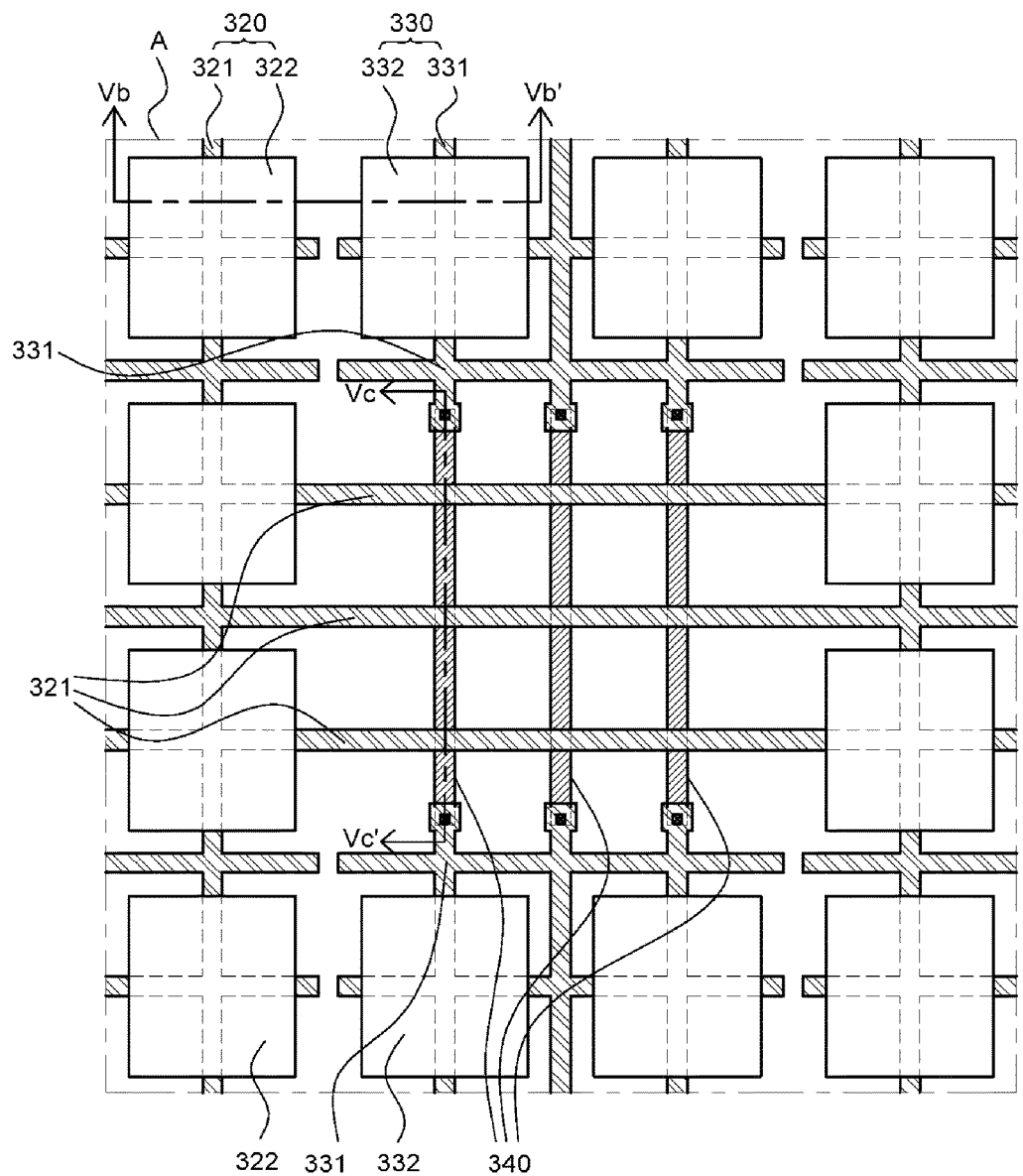

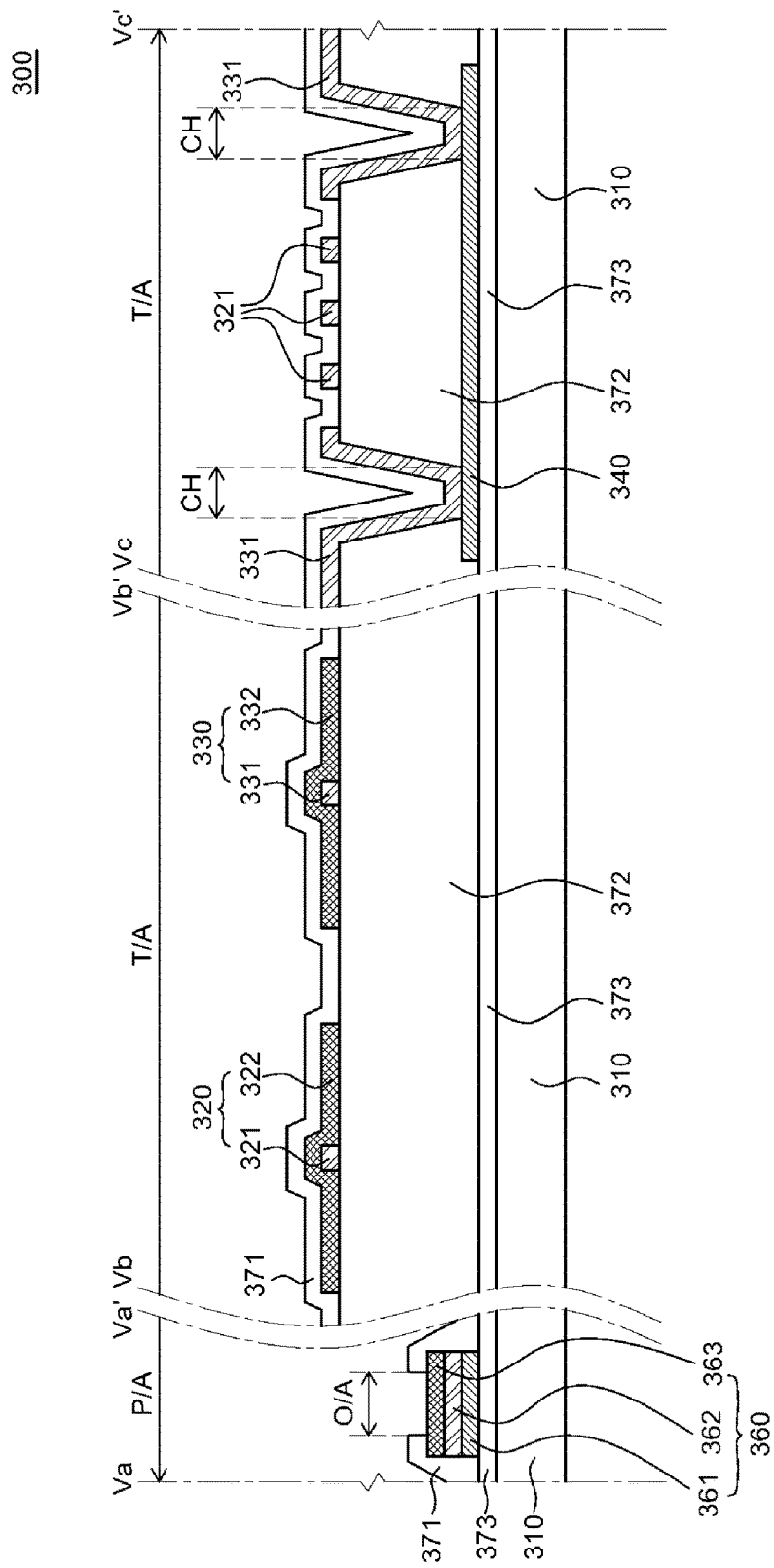
[Fig. 5]

[Fig. 6]
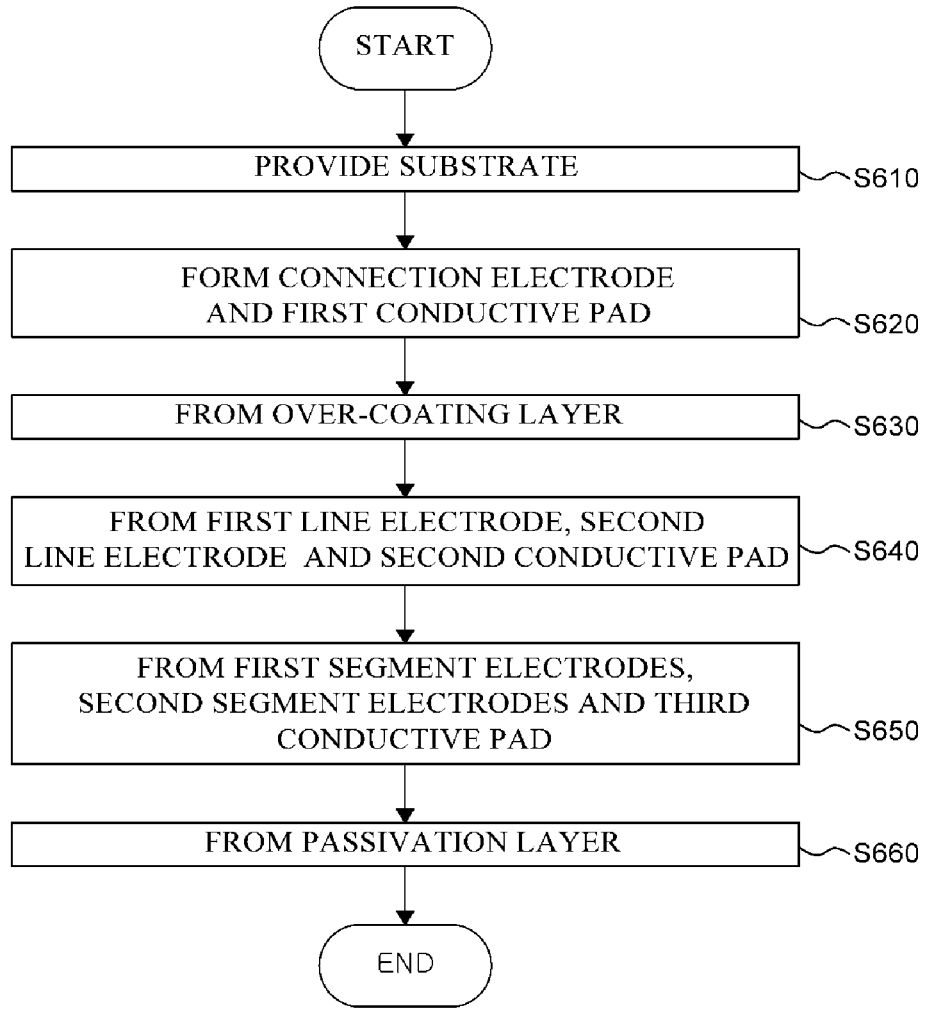
[Fig. 7A]
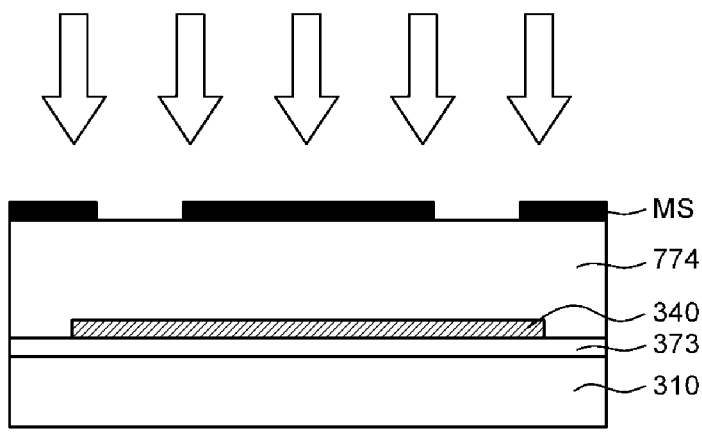

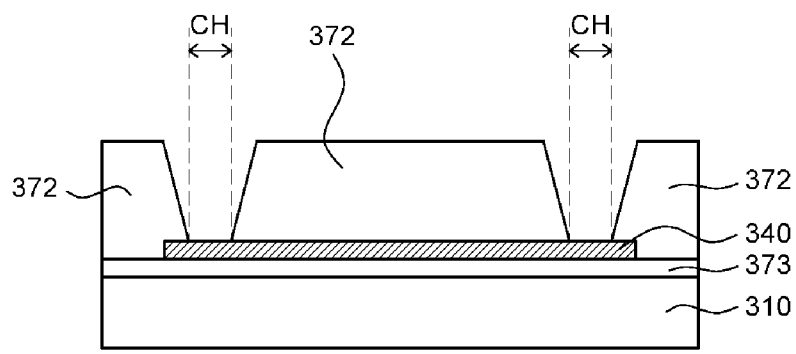
[Fig. 7B]

[Fig. 8]
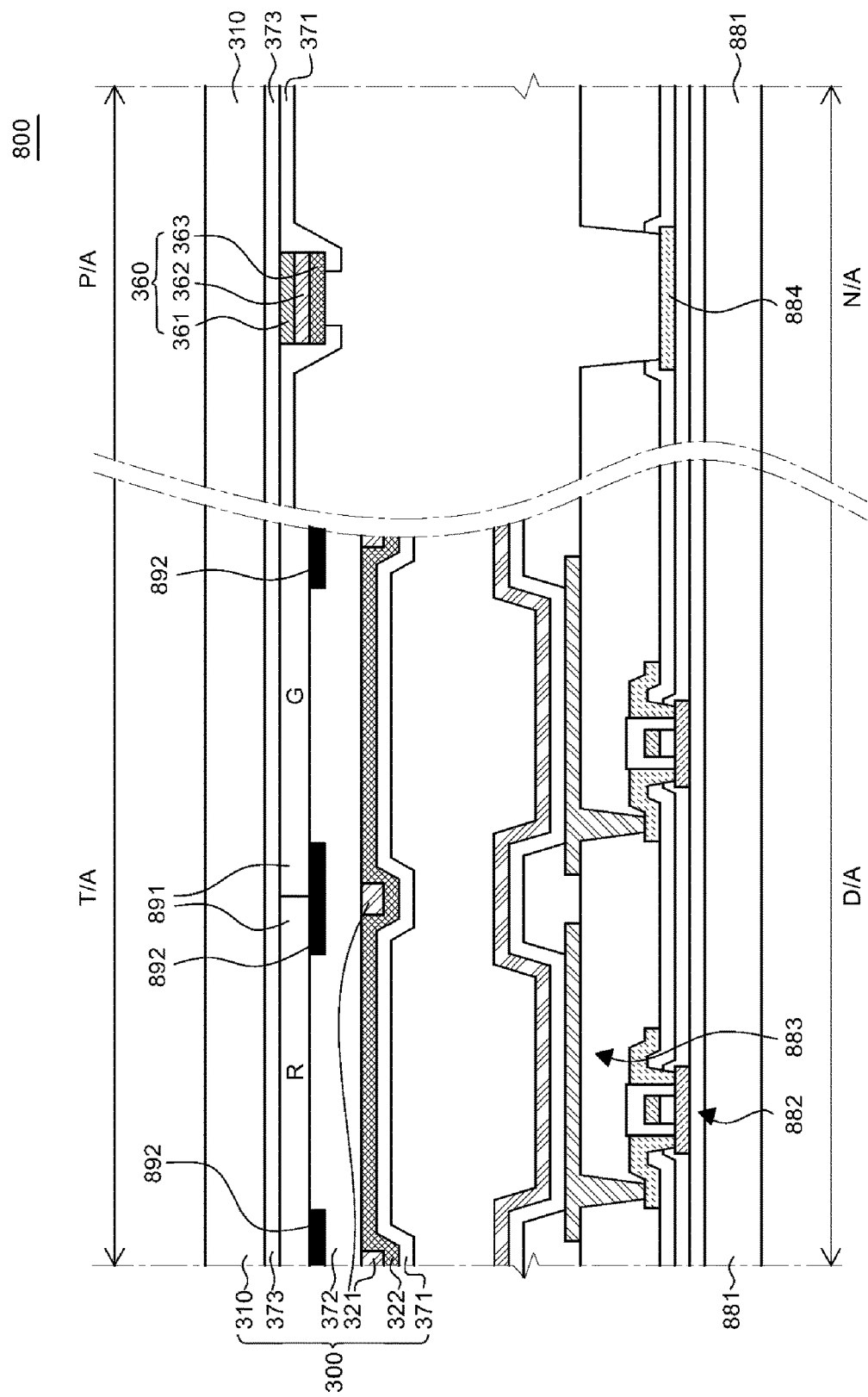

[Fig. 9]
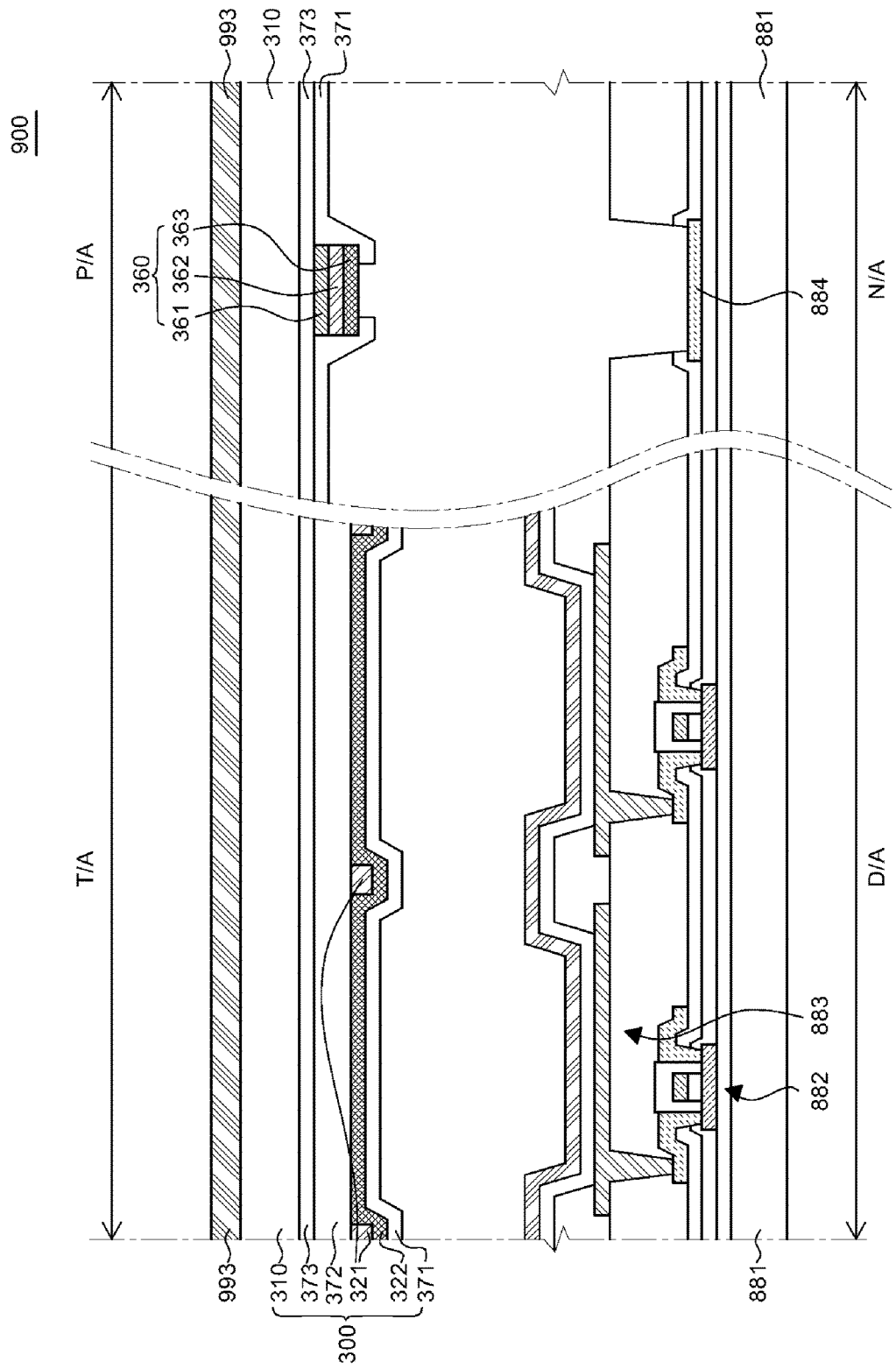

TOUCH PANEL, METHOD OF MANUFACTURING THE SAME AND TOUCH PANEL INTEGRATED ORGANIC LIGHT EMITTING DISPLAY DEVICE

TECHNICAL FIELD

The present disclosure relates to a touch panel, a method of manufacturing the same, and a touch panel integrated organic light emitting display device, and more particularly, to a touch panel having excellent touch sensitivity while having a small thickness, a method of manufacturing the same, and a touch panel integrated organic light emitting display device.

BACKGROUND ART

A touch panel as a device of sensing a touch input of a user on a display device has been widely used in display device in public facilities and in large display devices such as a smart TV in addition to personal portable devices such as a smart phone and a tablet PC.

Recently, in order to decrease the thickness of the display device and improve visibility, an in-cell type touch panel integrated display device in which the touch panel is integrated to the display device has been developed. Generally, the touch panel includes a transparent touch electrode made of transparent conductive oxide (TCO). Although the transparent touch electrode improves visibility of the touch panel integrated display device, it has high resistance, and thus, an RC-delay of the touch panel is increased. In order to solve the problem, a touch panel having a metal mesh structure including a line electrode with a mesh pattern has been developed.

FIG. 1 is a schematic plan view for describing a touch panel having a metal mesh structure in the related art. FIG. 2 is a schematic cross-sectional view for IIa-IIa' and IIb-IIb' of FIG. 1. Referring to FIGS. 1 and 2, a touch panel 100 having a metal mesh structure in the related art includes a substrate 110, a first line electrode 120, a second line electrode 130, a routing line 150, and a pad 160. The first line electrode 120 and the second line electrode 130 are extended in different directions, and the second line electrodes 130 are separated from each other in a cross area. The first line electrode 120 passes between the separated second line electrodes 130, and the separated second line electrodes 130 are connected with each other by a connection electrode 140 in the cross area. As a result, the first line electrode 120 and the second line electrode 130 may cross each other while being electrically separated from each other.

The first line electrode 120, the second line electrode 130, the routing line 150, and the pad 160 are disposed on the same layer on the substrate 110 and made of a metal such as copper (Cu). However, since copper (Cu) is oxidized well, a passivation layer 172 made of an inorganic material is disposed on the first line electrode 120, the second line electrode 130, the routing line 150, and the pad 160. On the passivation layer 171, an over-coating layer 172 for electrically separating the first line electrode 120 and the connection electrode 140 from each other and planarizing an upper surface of the touch panel 100 is disposed. In order to connect the separate second line electrodes 130 with the connection electrode 140 in the cross area, contact holes may be formed in the over-coating layer 172 and the passivation layer 171, respectively. The contact hole of the over-coating layer 172 is formed by development and the contact hole of the passivation layer 171 is formed by a dry etching process. However, since it is difficult to control an etching degree by the dry etching process, the passivation layer 171 may be more internally etched than the side surface of the over-coating layer 172. Accordingly, as illustrated in FIG. 2, in the process of forming the contact holes, an undercut structure DP in which the passivation layer 172 is recessed inside the over-coating layer 172 is frequently generated. The connection electrode 140 is formed on the over-coating layer 172 by a deposition process, and the connection electrodes 140 are disconnected from each other by the undercut structure DP. As a result, the second line electrode 130 and the connection electrode 140 are not connected with each other.

Meanwhile, when the contact holes are formed in the over-coating layer 172 and the passivation layer 171, an opening OA exposing the pad 160 may be simultaneously formed. After the opening OA is formed, the connection electrode 140 is patterned. Further, in a process of etching the connection electrode 140, the pad 160 is often damaged by an etchant for etching the connection electrode 140.

DISCLOSURE OF INVENTION

Technical Problem

The inventors of the present disclosure recognized that there was a problem in that touch sensitivity deteriorated as thickness of a touch panel having a metal mesh structure was decreased and many defects may be generated in a manufacturing process as thickness of a touch panel was decreased. Accordingly, the inventors of the present disclosure conducted researches for the touch panel structure capable of compensating for disadvantages of the metal mesh structure. As a result they invented a touch panel having a new structure including line electrodes having mesh patterns and a plurality of segment electrodes connected with the line electrodes, a method of manufacturing the same, and a touch panel integrated organic light emitting display device.

Thus, an object of the present disclosure is to provide a touch panel having small thickness, a low RC-delay, and improved touch sensitivity, a method of manufacturing the same, and a touch panel integrated organic light emitting display device.

Another object of the present disclosure is to provide a touch panel without forming an undercut structure by changing positions of a connection electrode and a line electrode, a method of manufacturing the same, and a touch panel integrated organic light emitting display device.

Yet another object of the present disclosure is to provide a touch panel capable of minimizing damage to a pad due to an etchant for etching a metal by changing the structure of a pad, a method of manufacturing the same, and a touch panel integrated organic light emitting display device.

The objects of the present disclosure are not limited to the aforementioned objects, and other objects, which are not mentioned above, will be apparent to a person having ordinary skill in the art from the following description.

Solution to Problem

According to an exemplary embodiment of the present disclosure, there is provided a touch panel. The touch panel includes: a substrate, a plurality of connection electrodes, an over-coating layer, a first line electrode, a second line electrode, a plurality of first segment electrodes, and a plurality of second segment electrodes. The plurality of connection electrodes is disposed on the substrate to be separated from each other. The over-coating layer covers the connection electrodes and the over-coating layer includes a plurality of contact holes exposing a part of each connection electrode. The first line electrode is disposed on the over-coating layer with a first mesh pattern. The second line electrode is electrically separated from the first line electrode, disposed with a second mesh pattern crossing the first mesh pattern, and connected with the connection electrode through the contact hole of the over-coating layer. The first segment electrodes are electrically connected with the first line electrode, respectively. The second segment electrodes are electrically connected with the second line electrode, respectively. The touch panel according to the exemplary embodiment of the present disclosure includes the first line electrode and the second line electrode having the mesh patterns, so that resistance of the touch electrode can be decreased and an RC-delay can be decreased. Further, the touch panel includes the plurality of first segment electrodes connected with the first line electrode and the plurality of second segment electrodes connected with the second line electrode, so that an effective capacitance of the first line electrode and the second line electrode can be increased. Thus, the touch panel may have improved touch sensitivity while having the small thickness. Meanwhile, an inorganic layer is not disposed below the over-coating layer, so that an undercut of the contact holes is not formed and the second line electrode may be connected with the connection electrode without disconnection. Thus, reliability of the touch panel can be improved.

According to another feature of the present disclosure, the touch panel further includes a passivation layer covering the first line electrode, the second line electrode, the first segment electrodes, and the second segment electrodes.

According to yet another feature of the present disclosure, the passivation layer is made of an inorganic material, and the over-coating layer is made of an organic material.

According to still another feature of the present disclosure, the over-coating layer directly contacts the connection electrodes. The passivation layer directly contacts the first line electrode and the second line electrode.

According to still another feature of the present disclosure, the substrate includes a touch area in which the first line electrode, the second line electrode, the connection electrodes, the first segment electrodes, and the second segment electrodes are disposed, and a peripheral area surrounding the touch area. Further, the over-coating layer is disposed only in the touch area, and the passivation layer is disposed in both the touch area and the peripheral area.

According to still another feature of the present disclosure, the touch panel further includes a plurality of pads disposed in the peripheral area on the substrate. Each pad is separately connected with the first line electrode and the second line electrode, respectively. Each pad includes a first conductive pad, a second conductive pad and a third conductive pad. The first conductive pad is made of the same conductive material as the connection electrode. The second conductive pad is disposed on the first conductive pad and made of the same conductive material as the first line electrode. The third conductive pad is disposed on the second conductive pad and made of the same conductive material as the first segment electrode. Further, the passivation layer includes an opening exposing a part of the third conductive pad.

According to still another feature of the present disclosure, each of the connection electrode, the first line electrode, and the second line electrode is made of a metal. Moreover, each of the first segment electrodes and the second segment electrodes is made of transparent conductive oxide (TCO).

According to still another feature of the present disclosure, the connection electrodes and the first conductive pad include at least one of gold (Au), silver (Ag), a Ag—Pd—Cu alloy (APC), and a multilayered structure configured by molybdenum (Mo)/aluminum (Al)/molybdenum (Mo). Further, the first line electrode, the second line electrode, and the second conductive pad include at least one metal selected from a group consisting of copper (Cu), aluminum, molybdenum, chromium (Cr), and titanium (Ti).

According to still another feature of the present disclosure, the touch panel further includes a buffer layer covering the substrate. The buffer layer is disposed below the connection electrode.

According to an exemplary embodiment of the present disclosure, there is provided a method of manufacturing a touch panel. The method of manufacturing a touch panel includes: providing a substrate including a touch area and a peripheral area surrounding the touch area; forming a plurality of connection electrodes disposed in the touch area and a first conductive pad disposed in the peripheral area, respectively; forming an over-coating layer including a plurality of contact holes exposing parts of the connection electrodes, respectively, the over-coating layer exposing the peripheral area of the substrate; forming a first line electrode, a second line electrode and a second conductive pad on the over-coating layer, where the first line electrode is disposed with a first mesh pattern, the second line electrode is electrically separated from the first line electrode, the second line electrode is disposed with a second mesh pattern crossing the first mesh pattern, the second line electrode is connected with the connection electrode through the contact hole of the over-coating layer, and the second conductive pad is disposed on the first conductive pad; forming a plurality of first segment electrodes connected with the first line electrode, a plurality of second segment electrodes connected with the second line electrode, and a third conductive pad disposed on the second conductive pad; and forming a passivation layer covering the first segment electrode and the second segment electrode and exposing a part of the third conductive pad. In the method of manufacturing the touch panel according to the exemplary embodiment of the present disclosure, the over-coating layer including a contact holes having a flat side surface is formed, and the second line electrode connected with the connection electrodes without disconnection through the contact holes of the over-coating layer is formed. Thus, reliability of the touch panel can be improved. Further, after forming the passivation layer, an additional patterning process is not added, so that damage to the pad that may be caused by the patterning process can be suppressed.

According to another feature of the present disclosure, the forming of the over-coating layer includes forming an organic layer on the substrate to cover the connection electrode and the first conductive pad, exposing the organic layer, and developing the exposed organic layer.

According to yet another feature of the present disclosure, the forming of the passivation layer includes forming an inorganic layer to cover the first segment electrode, the second segment electrode, and the third conductive pad, forming a photoresist layer on the inorganic layer, patterning the photoresist layer, dry etching the inorganic layer based on a pattern of the patterned photoresist layer, and removing the pattern of the photoresist layer.

According to an exemplary embodiment of the present disclosure, there is provided a touch panel integrated organic light emitting display device. The touch panel integrated organic light emitting display device includes: a lower substrate, a thin film transistor, an organic light emitting element, an upper substrate, a plurality of connection electrodes, an over-coating layer, a first line electrode, a second line electrode, a plurality of first segment electrodes and a plurality of second segment electrodes. The thin film transistor is disposed on the lower substrate. The organic light emitting element is electrically connected with the thin film transistor. The upper substrate is facing the lower substrate. The plurality of connection electrodes are separated from each other below the upper substrate. The over-coating layer covers the connection electrodes and includes a plurality of contact holes exposing parts of the connection electrodes, respectively. The first line electrode is disposed below the over-coating layer with a first mesh pattern. The second line electrode are electrically separated from the first line electrode, the second line electrode is disposed with a second mesh pattern crossing the first mesh pattern, and the second line electrode is connected with the connection electrodes through the contact holes of the over-coating layer. The plurality of first segment electrodes are electrically connected with the first line electrode. The plurality of second segment electrodes are electrically connected with the second line electrode. The touch panel integrated organic light emitting display device according to the exemplary embodiment of the present disclosure includes the first line electrode and the second electrode having a mesh pattern, so that resistance of the touch electrode can be decreased, and includes a plurality of first segment electrodes and second segment electrodes which have electrode surfaces and are separated from each other in segment form to have improved touch sensitivity even though the thickness of the touch panel integrated organic light emitting display device is small. Further, an inorganic layer is not disposed below the over-coating layer, so that an undercut of the contact holes is not formed and the second line electrode may be stably connected with the connection electrode.

According to another feature of the present disclosure, the touch panel integrated organic light emitting display device further includes a color filter layer disposed below the upper substrate, and a black matrix disposed below the color filter layer. The connection electrode overlaps with the black matrix below the black matrix, and the first line electrode and the second line electrode overlaps with the black matrix, respectively.

According to yet another feature of the present disclosure, the touch panel integrated organic light emitting display device further includes a polarizer disposed on the upper substrate.

According to still another feature of the present disclosure, the touch panel integrated organic light emitting display device further includes a plurality of pads disposed below the upper substrate and separately connected with the first line electrode and the second line electrode, respectively. Specifically, the lower substrate includes a display area in which the organic light emitting element is disposed and a non-display area surrounding the display area. The upper substrate includes a touch area corresponding to the display area of the lower substrate and a peripheral area corresponding to the non-display area of the lower substrate, and the pad is disposed in the peripheral area of the upper substrate.

According to still another feature of the present disclosure, the touch panel integrated organic light emitting display device further includes a passivation layer covering the first segment electrodes and the second segment electrodes and exposing a part of the pad.

Details of other exemplary embodiments will be included in the detailed description of the disclosure and the accompanying drawings.

Advantageous Effects of Invention

According to the present disclosure, the line electrodes having mesh patterns and the plurality of segment electrodes connected with the line electrodes are included. Thus, it is possible to significantly decrease an RC-delay in spite of small thickness and improve touch sensitivity.

According to the present disclosure, the over-coating layer directly contacting the connection electrode is included. Thus, an undercut structure in which the passivation layer is recessed inside the side surface of the over-coating layer is not generated. It is possible to minimize a defect in which the connection electrode and the line electrode are disconnected from each other by the undercut structure.

Further, according to the present disclosure, a pad including the first conductive pad, the second conductive pad, and the third conductive pad is provided. Thus, it is possible to improve reliability of the touch panel without damaging the pad by an etchant for etching a metal.

The effects of the present disclosure are not limited to the aforementioned effects, and other various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which:

FIG. 3 is a schematic plan view for describing a touch panel according to an exemplary embodiment of the present disclosure;

FIG. 4 is an enlarged plan view for a region A of FIG. 3;

FIG. 5 is a schematic cross-sectional view for Va-Va' of FIG. 3, and Vb-Vb' and Vc-Vc' of FIG. 4;

FIG. 6 is a flowchart for describing a method of manufacturing a touch panel according to another exemplary embodiment of the present disclosure;

FIGS. 7A and 7B are schematic cross-sectional views for describing a process of forming an over-coating layer of FIG. 6;

FIG. 8 is a schematic cross-sectional view for describing a touch panel integrated organic light emitting display device according to an exemplary embodiment of the present disclosure; and FIG. 9 is a schematic cross-sectional view for describing a touch panel integrated organic light emitting display device according to another exemplary embodiment of the present disclosure.

BEST MODE FOR CARRYING OUT THE INVENTION

Figure 1:
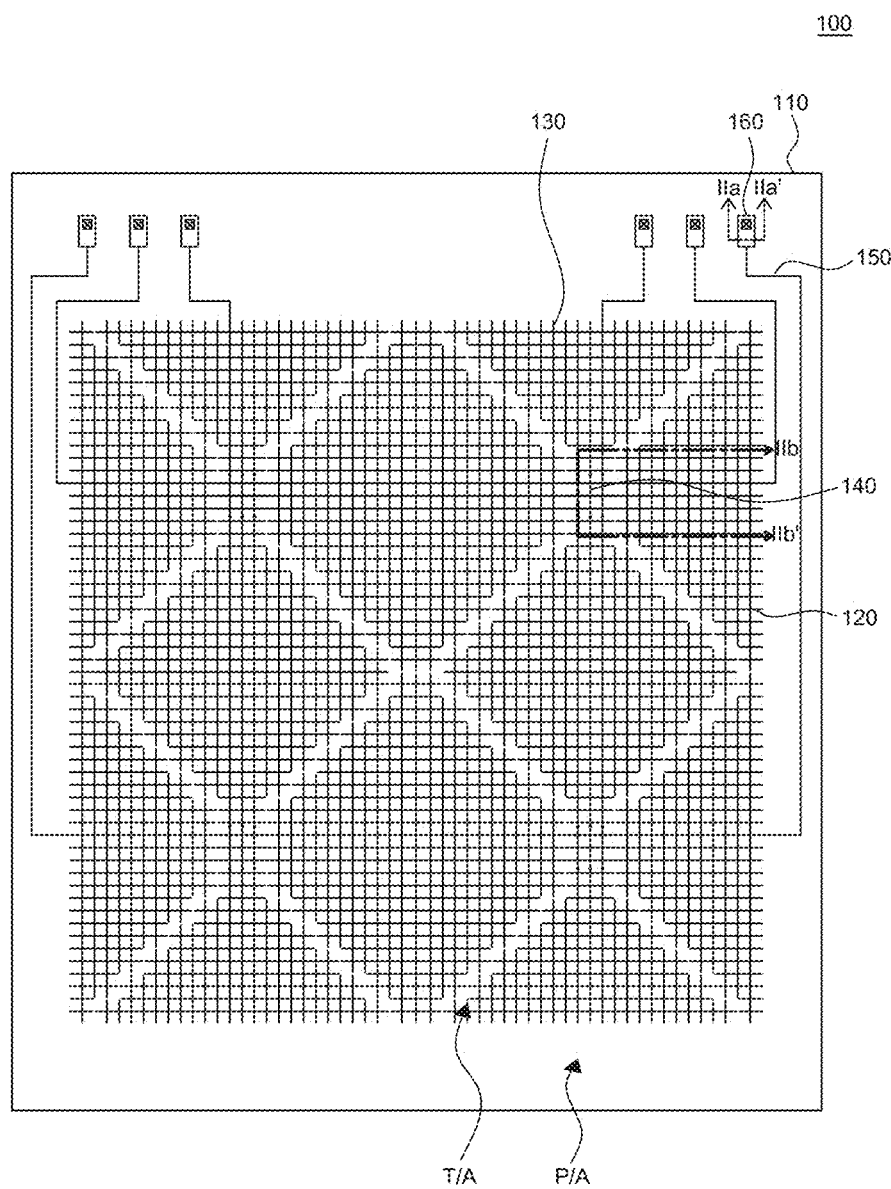
FIG. 1 is a schematic plan view for describing a touch panel having a metal mesh structure in the related art.
Figure 2:
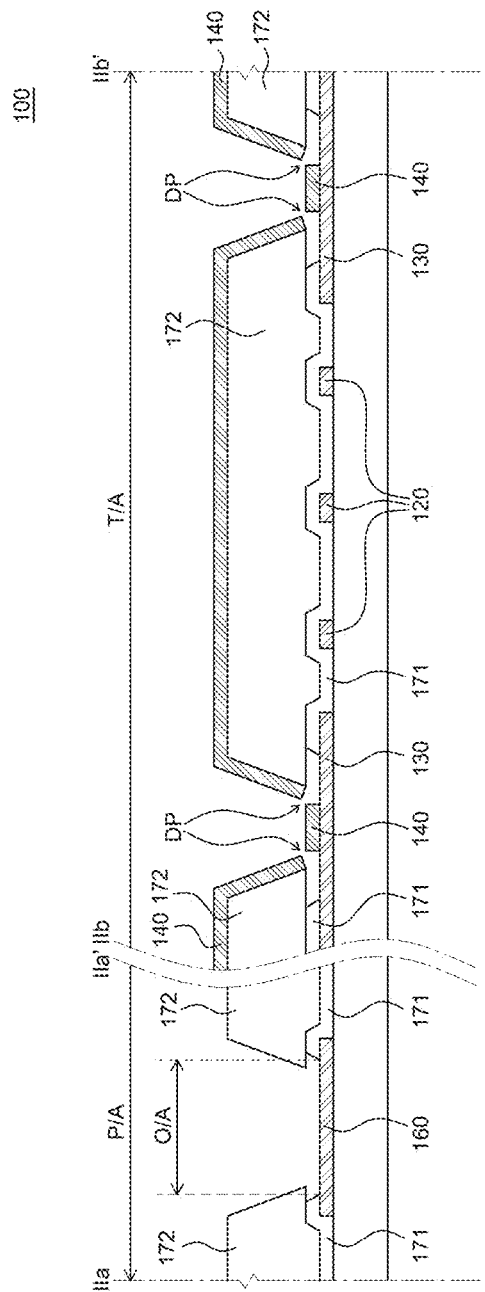
FIG. 2 is a schematic cross-sectional view for IIa-IIa' and IIb-IIb' of FIG. 1.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

FIG. 3 is a schematic plan view for describing a touch panel according to an exemplary embodiment of the present disclosure. FIG. 4 is an enlarged plan view for a region A of FIG. 3. FIG. 5 is a schematic cross-sectional view for Va-Va' of FIG. 3, and Vb-Vb' and Vc-Vc' of FIG. 4. Referring to FIGS. 3 to 5, a touch panel 300 includes a substrate 310, a first line electrode 321, a second line electrode 331, a first segment electrode 322, a second segment electrode 332, a connection electrode 340, a routing line 350, and a pad 360.

For convenience of description, in FIGS. 3 to 5, thicknesses and widths of the first line electrode 321, the second line electrode 331, the routing line 350, and the pad 360 are schematically illustrated.

The substrate 310 as a substrate for supporting many elements of the touch panel 300 may be a glass substrate or a plastic substrate. In some exemplary embodiments, the substrate 310 may be a flexible substrate having flexibility. For example, the substrate 310 may be a polymer film including one selected from a group consisting of polyester-based polymers, silicon-based polymers, acrylic polymers, polyolefin-based polymers, and copolymers thereof.

The substrate 310 includes a touch area T/A and a peripheral area P/A. The touch area T/A means an area in which the first line electrode 321, the second line electrode 331, the first segment electrode 322, the second segment electrode 332 and the connection electrode 340 are disposed and a touch input of a user is possible, and the peripheral area P/A means the remaining area except for the touch area T/A. In the peripheral area P/A, the routing line 350 and the pad 360 are disposed.

Referring to FIG. 5, a barrier layer 373 is disposed on the substrate 310. The barrier layer 373 suppresses moisture or impurities from penetrating through the substrate 310 and planarizes a surface of the substrate 310. In some exemplary embodiments, the barrier layer 373 may be omitted.

The connection electrode 340 is disposed in the touch area T/A of the substrate 310. For example, the connection electrode 340 is disposed on the barrier layer 373 in the touch area T/A. If the barrier layer 373 is omitted, the connection electrode 340 may be disposed on the substrate 310 in the touch area T/A. The touch panel 300 includes a plurality of connection electrodes 340. In FIG. 5, for convenience of description, only one connection electrode 340 is illustrated. The plurality of connection electrodes 340 is disposed on the substrate 310 to be separated from each other. The connection electrode 340 may be made of a metal which has low resistance and is not relatively oxidized. For example, the connection electrode 340 may include at least one of gold (Au), silver (Ag), a Ag—Pd—Cu alloy (APC), and a multilayered structure configured by molybdenum (Mo)/aluminum (Al)/molybdenum (Mo).

A first conductive pad 361 is disposed in the peripheral area P/A on the substrate 310. For example, the first conductive pad 361 is disposed on the barrier layer 373 in the peripheral area P/A. The first conductive pad 361 may be made of the same metal as the connection electrode 340.

The over-coating layer 372 is disposed on the connection electrode 340. The over-coating layer 372 is disposed only in the touch area T/A of the substrate 310. That is, the over-coating layer 372 is not disposed in the peripheral area P/A of the substrate 310. The touch area T/A of the substrate 310 may be substantially planarized by the over-coating layer 372. The over-coating layer 372 covers the connection electrode 340. The over-coating layer 372 may directly contact the connection electrode 340. The over-coating layer 372 includes a plurality of contact holes CH exposing the connection electrode 340. A part of the connection electrode 340 is exposed by the contact holes CH. When the touch panel 300 is applied to a display device, the over-coating layer 372 may be made of a transparent insulating material so as not to deteriorate visibility of the display device. For example, the over-coating layer 372 may be made of an organic insulating material such as photo acryl (PAC).

The first line electrode 321 is disposed on the over-coating layer 372 in the touch area T/A. The first line electrode 321 is disposed with a first mesh pattern. The first line electrode 321 disposed with the first mesh pattern may correspond to a predetermined shape. For example, an area defined along the outside of the first line electrode 321 may have a plurality of rhombus shapes. In FIG. 3, the first line electrode 321 corresponding to the rhombus shape is illustrated.

The first line electrode 321 may be made of a metal having low resistance. For example, the first line electrode 321 may be made of at least one metal selected from a group consisting of copper (Cu), aluminum, molybdenum, chromium (Cr), and titanium (Ti).

The second line electrode 331 is disposed on the over-coating layer 372 in the touch area T/A. The second line electrode 331 is disposed with a second mesh pattern. The second line electrode 331 disposed with the second mesh pattern may correspond to a predetermined shape. For example, an area defined along the outside of the second line electrode 331 may have a plurality of rhombus shapes.

The second line electrode 331 may be made of a metal having low resistance. For example, the second line electrode 331 may be made of the same metal as the metal configuring the first line electrode 321.

The second mesh pattern crosses the first mesh pattern. An area where the first mesh pattern and the second mesh pattern cross each other is called "a cross area". The second line electrodes 331 are separated from each other in the cross area. The first line electrode 321 passes through a spaced between the separated second line electrodes 331. As illustrated in FIG. 4, the second line electrode 331 is electrically connected with the connection electrode 340 in the cross area. For example, as illustrated in FIG. 5, the second line electrode 331 is directly connected with the connection electrode 340 through the contact hole CH of the over-coating layer 372. In some exemplary embodiments, a separate conductive member connecting the second line electrode 331 and the connection electrode 340 may be disposed in the contact hole CH of the over-coating layer 372. Further, the second line electrode 331 may be electrically connected with the connection electrode 340 through the separate conductive member.

The second line electrode 331 is not disconnected along the contact hole CH of the over-coating layer 372 but connected with the connection electrode 340. As described above, the touch panel having the metal mesh structure in the related art includes an inorganic layer disposed below the over-coating layer made of an organic material in order to suppress oxidization of the metal mesh electrode. In this case, in a process of forming the over-coating layer and the contact hole in the inorganic layer, an undercut structure is generated by a difference in etch rate between the inorganic layer and the over-coating layer. Further, the connection electrode may not be connected with the second line electrode due to the undercut structure. However, since the touch panel 300 according to the exemplary embodiment of the present disclosure includes the connection electrode 340 configured by a metal which is not relatively oxidized as compared with the first line electrode 321 and the second line electrode 331, the inorganic layer below the over-coating layer 372 may be omitted. That is, the undercut structure is not formed, and the second line electrode 331 may be stably connected with the connection electrode 340 along the contact hole CH of the over-coating layer 372. As a result, the second line electrodes 331 separated from each other in the cross area may be connected to each other through the connection electrode 340 and serve as one touch electrode.

Meanwhile, since the first line electrode 321 and the second line electrode 331 have relatively low resistance as compared with a transparent electrode made of TCO, an RC-delay of the touch panel 300 may be decreased and a response speed of the touch panel 300 may be improved. Further, since the metal has high flexibility, as compared with the transparent electrode made of TCO, the first line electrode 321 and the second line electrode 331 may have high flexibility.

A second conductive pad 362 is disposed in the peripheral area P/A on the substrate 310. For example, the second conductive pad 362 is disposed on the first conductive pad 361 in the peripheral area P/A. The second conductive pad 362 may be made of the same metal as the first line electrode 321.

Each of a plurality of first segment electrodes 322 are electrically connected with the first line electrode 321. The first segment electrode 322 overlaps with one cross point of the first line electrode 321 as illustrated in FIG. 4. The first segment electrodes 322 may be disposed substantially at regular distances. The first segment electrode 322 may be made of TCO. For example, the first segment electrode 322 may be made of TCO such as indium tin oxide (ITO) or indium zinc oxide (IZO). Since the first segment electrode 322 has transparency, when the touch panel 300 is applied to the display device, the touch panel 300 may not deteriorate visibility of the display device.

Each of a plurality of second segment electrodes 332 are electrically connected with the second line electrode 331. The second segment electrode 332 overlaps with one cross point of the second line electrode 331 as illustrated in FIG. 4. The second segment electrodes 332 may be disposed substantially at regular distances. The second segment electrodes 332 may be made of the same material as the first segment electrodes 322. In this case, when the touch panel 300 is applied to the display device, the touch panel 300 may not deteriorate visibility of the display device. The second segment electrodes 332 are connected with the second line electrodes 331, respectively, to serve as one second touch electrode 330.

The first segment electrode 322 and the second segment electrode 332 have electrode surfaces, respectively. Since the first line electrode 321 and the second line electrode 331 are thin metal lines, an electrode area for sensing touch is small. When the electrode area of the touch electrode is small, an effective capacitance for sensing touch may be decreased. That is, in the touch panel having the metal mesh structure in the related art, since the effective capacitance of the touch electrode is very small, when the thickness of the touch panel is small, touch sensitivity may deteriorate. However, since the first segment electrode 322 and the second segment electrode 332 have the electrode surfaces, the effective capacitance for sensing the touch of the first touch electrode 320 and the second touch electrode 330 may be increased. As a result, even though the thickness of the touch panel 300 is decreased, the touch sensitivity may be improved. That is, the first segment electrode 322 and the second segment electrode 332 reinforce the effective capacitance of the first line electrode 321 and the second line electrode 331 and may improve the touch sensitivity of the touch panel 300. Meanwhile, since the first line electrode 321 connecting the first segment electrodes 322 and the second line electrode 331 connecting the second segment electrodes 332 may be bent, respectively, the first touch electrode 320 and the second touch electrode 330 may entirely have flexibility.

A third conductive pad 363 is disposed on the second conductive pad 362 in the peripheral area P/A. The third conductive pad 363 may be made of the same material as the first segment electrode 322 and the second segment electrode 332. For example, the third conductive pad 363 may be made of TCO such as ITO and IZO. The third conductive pad 363 protects the second conductive pad 362 and the first conductive pad 361. For example, the third conductive pad 363 covers an upper surface of the second conductive pad 362 and may suppress oxidization of the second conductive pad 362 and the first conductive pad 361.

A passivation layer 371 is disposed on the touch area T/A and the peripheral area P/A of the substrate 310. For example, the passivation layer 371 covers the first line electrode 321, the second line electrode 331, the first segment electrode 322, and the second segment electrode 332 in the touch area T/A and partially covers the pad 360 in the peripheral area P/A. The first line electrode 321, the second line electrode 331, the first segment electrode 322, and the second segment electrode 332 directly contact the passivation layer 371. The passivation layer 371 may be made of an inorganic material. For example, the passivation layer 371 may include at least one of silicon nitride (SiNx), aluminum oxide ($Al_2O_3$), and silicon oxide (SiOx). The passivation layer 371 suppresses moisture or impurities from penetrating into the touch panel 300 and suppresses oxidization of the first line electrode 321 and the second line electrode 331.

The passivation layer 371 includes an opening O/A exposing the pad 360. The third conductive pad 363 of the pad 360 is exposed through the opening O/A of the passivation layer 371. Further, a touch signal generated in the first touch electrode 320 or the second touch electrode 330 may be transferred to an external circuit through the third conductive pad 363 exposed through the opening O/A.

The routing line 150 is disposed in the peripheral area P/A of the substrate 310 and separately connected with the first line electrode 321 and the second line electrode 331. The routing line 150 separately connects the first line electrode 321 and the second line electrode 331 with the pad 360, respectively.

As described above, since the touch panel 300 according to the exemplary embodiment of the present disclosure includes the first line electrode 321 and the second line electrode 331 having low resistance, the entire resistance of the touch electrode may be decreased and the RC-delay of the touch panel 300 may be decreased. Further, since the first segment electrode 322 and the second segment electrode 332 compensate for the effective capacitance of the first line electrode 321 and the second line electrode 331, even though the thickness of the touch panel 300 is small, the touch electrode may have a sufficient effective capacitance. As a result, the touch panel 300 may have excellent touch sensitivity while having small thickness. Meanwhile, the connection electrode 340 of the touch panel 300 is disposed below the first line electrode 321 and the second line electrode 331. The inorganic layer is not disposed on the connection electrode 340, and the over-coating layer 372 made of an organic material is disposed. As a result, the undercut structure is not formed. That is, since the connection electrode 340 includes a contact hole CH having a substantially flat side surface, the second line electrode 331 is connected with the connection electrode 340.

FIG. 6 is a flowchart for describing a method of manufacturing a touch panel according to another exemplary embodiment of the present disclosure. FIGS. 7A and 7B are schematic cross-sectional views for describing a process of forming an over-coating layer of FIG. 6. Since the touch panel manufactured through a manufacturing method of FIG. 6 is the same as the touch panel 300 illustrated in FIGS. 3 to 5, the method of manufacturing the touch panel according to another exemplary embodiment of the present disclosure will be described with reference to FIGS. 3 to 5 together.

First, referring to FIG. 6, the method of manufacturing a touch panel 300 provides a substrate 310 including a touch area T/A and a peripheral area P/A (S610).

Thereafter, a plurality of connection electrodes 340 disposed in the touch area T/A of the substrate 310 and a first conductive pad 361 disposed in the peripheral area P/A are formed, respectively (S620).

The connection electrodes 340 and the first conductive pad 361 are formed by a patterning process. In detail, a first conductive layer is formed to cover the entire surface of the substrate 310. For example, the first conductive layer may be formed by a multilayered structure by alternately depositing molybdenum, aluminum, and molybdenum. Thereafter, the connection electrodes 340 and the first conductive pad 361 may be formed by patterning the first conductive layer using a photolithograpy process, respectively. The photolithograpy process involves an etch process, and the first conductive layer may be wet-etched through an etchant etching a metal.

Thereafter, an over-coating layer 372 including a plurality of contact holes CH exposing a part of each of the plurality of connection electrodes 340 and exposing the peripheral area P/A of the substrate 310 is formed (S630).

Referring to FIG. 7A, an organic layer 774 is formed to cover the entire surface of the substrate 310. The organic layer 774 may be obtained through various processes such as a deposition process, a sputtering process, a printing process, an ink-jet process, and a spin coating process. For example, the organic layer 774 may be formed of PAC. Thereafter, a mask MS is disposed on the organic layer 774, and the organic layer 774 exposed through the mask MS is exposed. The exposure may be implemented by using high-intensity ultraviolet ray. The mask MS may expose the area with the contact holes CH and the touch area T/A of the substrate 310, respectively.

Referring to FIG. 7B, the over-coating layer 372 is formed by developing the exposed organic layer 774. If the organic layer 774 is made of PAC, the exposed area of the organic layer 774 is removed through development. The peripheral area P/A of the substrate 310 is exposed by removing a part of the organic layer 774 through development to form the contact holes CH. As a result, the over-coating layer 372 including a plurality of contact holes CH and disposed in the touch area T/A of the substrate 310 is formed. The contact hole CH has a substantially flat side surface as illustrated in FIG. 7B, and a step is not formed at the side surface of the contact hole CH.

Thereafter, on the over-coating layer 372, the first line electrode 321 disposed with the first mesh pattern, the second line electrode 331 which is electrically separated from the first line electrode 321, disposed with the second mesh pattern crossing the first mesh pattern, and connected with the connection electrode 340 through the contact hole CH of the over-coating layer 372, and the second conductive pad 362 disposed on the first conductive pad 361 are formed (S640).

The first line electrode 321, the second line electrode 331, and the second conductive pad 362 are formed by a patterning process. In detail, a second conductive layer is formed to cover the over-coating layer 372 of the touch area T/A and the first conductive pad 361 of the peripheral area P/A. For example, the second conductive layer may be formed by depositing copper on the substrate 310. The second conductive layer is conformally formed to cover all of the upper surface of the over-coating layer 372, the side surface of the contact hole CH of the over-coating layer 372, and the upper surface of the connection electrode 340 exposed by the contact hole CH. As described above, since there is no step at the side surface of the contact hole CH, the second conductive layer is not disconnected. Thereafter, the first line electrode 321, the second line electrode 331, and the second conductive pad 362 are formed by patterning the second conductive layer, respectively. For example, the first line electrode 321, the second line electrode 331, and the second conductive pad 362 may be formed by etching the second conductive layer through the photolithography process and wet-etching the exposed second conductive layer, respectively.

Thereafter, a plurality of first segment electrodes 322 connected with the first line electrode 321, a plurality of second segment electrodes 332 connected with the second line electrode 331, and the third conductive pad 362 disposed on the second conductive pad 362 are formed (S650).

The plurality of first segment electrodes 322, the plurality of second segment electrodes 332, and the second conductive pad 362 are formed through a patterning process. In detail, a third conductive layer is formed to cover the first line electrode 321, the second line electrode 331, and the second conductive pad 362. For example, the third conductive layer may be formed by depositing TCO such as ITO and IZO. Thereafter, the first segment electrode 322, the second segment electrode 332, and the third conductive pad 363 are formed by patterning the third conductive layer, respectively.

Thereafter, a passivation layer covering the plurality of first segment electrodes 322 and the plurality of second segment electrodes 322 and exposing a part of the third conductive pad 363 is formed (S660).

In detail, an inorganic layer is formed to cover the plurality of first segment electrodes 322, the plurality of second segment electrodes 332, and the third conductive pad 363. The inorganic layer may be obtained through various processes such as a deposition process, a sputtering process, a printing process, an ink-jet process, and a spin coating process.

Thereafter, a photoresist layer is formed by coating a photoresist on the inorganic layer. A mask is disposed on the photoresist layer, and the photoresist layer exposed through the mask is exposed. If the photoresist layer is formed with a positive photoresist, the mask may expose an opening exposing the third conductive pad 363.

Thereafter, a pattern of the photoresist layer is formed by developing the exposed photoresist layer. The pattern of the photoresist layer exposes the opening by which the third conductive pad 363 is exposed.

Thereafter, the inorganic layer is patterned based on a second pattern. For example, the inorganic layer may be patterned by dry etching such as plasma etching, reactive ion etching (RIE), and high density plasma etching. However, the patterning method of the inorganic layer is not limited thereto. A part of the inorganic layer is removed through patterning. That is, the opening O/A exposing the third conductive pad 363 is formed through patterning. As a result, the passivation layer 371 is formed.

After the patterning process of forming the opening O/A, an additional patterning process is not performed. Since both the second conductive pad 362 and the first conductive pad 361 are made of metals, the second conductive pad 362 and the first conductive pad 361 may be easily damaged by an etchant which etches the metal in the patterning process. In a method of manufacturing the touch panel having the metal mesh structure in the related art, after the pad is formed, the connection electrode is patterned. When the connection electrode is patterned, the etchant etching the metal may flow into the pad exposed through the opening, and the pad may be damaged by the etchant etching the metal. However, in the method of manufacturing the touch panel according to another exemplary embodiment of the present disclosure, since an additional patterning process is not involved after patterning the opening O/A exposing the pad 360, the pad 360 exposed by the opening O/A may be protected. Further, even though the additional patterning process is involved, since the third conductive pad 363 exposed by the opening O/A is not easily damaged by the etchant etching the metal, the second conductive pad 362 and the first conductive pad 361 may be protected by the third conductive pad 363.

FIG. 8 is a schematic cross-sectional view for describing a touch panel integrated organic light emitting display device according to an exemplary embodiment of the present disclosure. Since a touch panel 300 included in a touch panel integrated organic light emitting display device 800 illustrated in FIG. 8 is substantially the same as the touch panel 300 illustrated in FIGS. 3 to 5, the duplicated description thereof will be omitted.

Referring to FIG. 8, a lower substrate 881 as a substrate for supporting many elements of the touch panel integrated organic light emitting display device 800 may be a glass substrate or a plastic substrate. According to some exemplary embodiments, the lower substrate 881 may be a plastic substrate having flexibility.

The lower substrate 881 includes a display area D/A and a non-display area N/A. The display area D/A is an area where a plurality of pixels configured by an organic light emitting element 883, and the non-display area N/A is the remaining area except for the display area D/A. In the non-display area N/A, a wire and a display pad 884 are disposed. The display area D/A corresponds to the touch area T/A of the touch panel 300, and the non-display area N/A corresponds to the peripheral area P/A of the touch panel 300.

A thin film transistor 882 is disposed on the lower substrate 881 and connected with the organic light emitting element 883. The thin film transistor 882 is a switching element for turning on or off the organic light emitting element 883.

The organic light emitting element 883 configures pixels of the touch panel integrated organic light emitting display device 800 and includes a cathode, an anode, and an organic emission layer interposed between the cathode and the anode. The organic light emitting element 883 emits light having a predetermined wavelength. For example, the organic emission layer may emit light of any one of red, green, blue, and white.

The display pad 884 is disposed in the non-display area N/A of the lower substrate 881. The display pad 884 transfers various signals to the thin film transistor 882 and is connected with a driving circuit of the display device.

A color filter layer 891 is disposed below an upper substrate 310. The color filter layer 891 includes a red color filter R, a green color filter G, and a blue color filter. The organic light emitting element 883 may display a predetermined color through the color filter layer 891.

A black matrix 892 is disposed below the color filter layer 891 in the touch area T/A. The black matrix 892 overlaps with the first line electrode 321 and the second line electrode, respectively. That is, since the first line electrode 321 and the second line electrode are covered by the black matrix 892, the first line electrode 321 and the second line electrode may not be viewed outside. The black matrix 892 is disposed with a mesh pattern below the color filter layer 891. For example, the black matrix is disposed to correspond to each boundary between the red color filter R, the green color filter G, and the blue color filter. The black matrix 892 suppresses a mixed color from being generated in the touch panel integrated organic light emitting display device 800.

Since the touch panel integrated organic light emitting display device 800 according to the exemplary embodiment of the present disclosure includes the first line electrode 321 and the second line electrode having the mesh patterns, resistance of the first touch electrode and the second touch electrode may be decreased and the RC-delay of the touch panel 300 may be decreased. Particularly, since the first line electrode 321 and the second line electrode overlap with the black matrix 891, reduction in visibility by the first line electrode 321 and the second line electrode may be minimized. Further, since the first segment electrode 322 and the second segment electrode increase an effective capacitance of the first line electrode 321 and the second line electrode, even though the thickness of the touch panel 300 is small, touch sensitivity of the touch panel 300 may be improved. As a result, a thin touch panel integrated organic light emitting display device 800 or a flexible touch panel integrated organic light emitting display device 800 may be easily implemented. Meanwhile, since the second line electrode 331 is not disconnected but connected with the connection electrode through the contact hole of the over-coating layer 372, reliability of the touch panel 300 may be improved.

MODE FOR THE INVENTION

FIG. 9 is a schematic cross-sectional view for describing a touch panel integrated organic light emitting display device according to another exemplary embodiment of the present disclosure. A touch panel integrated organic light emitting display device 900 illustrated in FIG. 9 is the same as the touch panel integrated organic light emitting display device 800 illustrated in FIG. 8. Except a black matrix and a color filter layer are omitted as compared with the touch panel integrated organic light emitting display device 800 illustrated in FIG. 8 and a polarizer 993 is further included in an upper substrate 310. Thus, the duplicated description will be omitted.

Referring to FIG. 9, the polarizer 993 includes a linear polarizer and a circular polarizer. It changes light input from the outside of the touch panel integrated organic light emitting display device 900 into a polarization state which is vertical to the linear polarizer to suppress an external light reflection phenomenon.

In the touch panel integrated organic light emitting display device 900 according to another exemplary embodiment of the present disclosure, since the black matrix and the color filter layer are omitted, the thickness of the touch panel integrated organic light emitting display device 900 may be further decreased. In this case, since the first line electrode 321 and the second line electrode are easily viewed from the outside, in order to reduce visibility of the first line electrode 321 and the second line electrode, a low-reflective member may be additionally disposed on or below the first line electrode 321 and the second line electrode. Further, a bank surrounding the organic light emitting element 883 may be formed as a black bank.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

The invention claimed is:

1. A touch panel comprising:
a substrate;
a plurality of connection electrodes disposed on the substrate to be separated from each other;
an over-coating layer covering the connection electrodes and including a plurality of contact holes exposing parts of the connection electrodes, respectively;
a first line electrode disposed on the over-coating layer with a first mesh pattern;
a second line electrode electrically separated from the first line electrode, disposed with a second mesh pattern crossing the first mesh pattern, and connected with the connection electrodes through the contact holes of the over-coating layer;
a plurality of first segment electrodes electrically connected with the first line electrode, respectively; and
a plurality of second segment electrodes electrically connected with the second line electrode, respectively,
wherein each of the plurality of first segment electrodes covers both the first line electrode and portions of the over-coating layer adjacent to the first line electrode, and each of the plurality of second segment electrodes covers both the second line electrode and portions of the over-coating layer adjacent to the second line electrode.

2. The touch panel according to claim 1, further comprising:
a passivation layer covering the first line electrode, the second line electrode, the first segment electrodes, and the second segment electrodes.

3. The touch panel according to claim 2, wherein the passivation layer is made of an inorganic material, and the over-coating layer is made of an organic material.

4. The touch panel according to claim 2, wherein the over-coating layer directly contacts the connection electrodes and the passivation layer directly contacts the first line electrode and the second line electrode.

5. The touch panel according to claim 2, wherein the substrate includes a touch area in which the first line electrode, the second line electrode, the connection electrode, the first segment electrodes, and the second segment electrodes are disposed, and a peripheral area surrounding the touch area;
wherein the over-coating layer is disposed only in the touch area; and
wherein the passivation layer is disposed in both the touch area and the peripheral area.

6. The touch panel according to claim 5, further comprising:
a plurality of pads disposed in the peripheral area on the substrate and separately connected with the first line electrode and the second line electrode, respectively,
wherein each pad includes a first conductive pad, a second conductive pad and a third conductive pad, the first conductive pad being made of the same conductive material as the connection electrode, the second conductive pad being disposed on the first conductive pad, the second conductive pad being made of the same conductive material as the first line electrode, the third conductive pad being disposed on the second conductive pad, and the third conductive pad being made of the same conductive material as the first segment electrode; and wherein the passivation layer includes an opening exposing a part of the third conductive pad.

7. The touch panel according to claim 6, wherein each of the connection electrodes, the first line electrode, and the second line electrode are made of a metal; and wherein each of the first segment electrodes and the second segment electrodes is made of transparent conductive oxide (TCO).

8. The touch panel according to claim 7, wherein the connection electrode and the first conductive pad include at least one of gold (Au), silver (Ag), a Ag—Pd—Cu alloy (APC), and a multilayered structure configured by molybdenum (Mo)/aluminum (Al)/molybdenum (Mo); and wherein the first line electrode, the second line electrode, and the second conductive pad include at least one metal selected from a group consisting of copper (Cu), aluminum, molybdenum, chromium (Cr), and titanium (Ti).

9. The touch panel according to claim 1, further comprising:
a buffer layer covering the substrate and disposed below the connection electrode.

10. The touch panel according to claim 1, wherein:
a material that forms the first and second line electrodes has a lower resistance than a material that forms the first and second segment electrodes; and
a material that forms the connection electrodes oxidizes less than a material that forms the first and second line electrodes.

11. A method of manufacturing a touch panel comprising:
providing a substrate including a touch area and a peripheral area surrounding the touch area;
forming a plurality of connection electrodes disposed in the touch area and a first conductive pad disposed in the peripheral area, respectively;
forming an over-coating layer including a plurality of contact holes exposing parts of the connection electrodes, respectively, the overcoating layer exposing the peripheral area of the substrate;
forming a first line electrode, a second line electrode and a second conductive pad on the over-coating layer, wherein the first line electrode is disposed with a first mesh pattern, the second line electrode is electrically separated from the first line electrode, the second line electrode is disposed with a second mesh pattern crossing the first mesh pattern, the second line electrode is connected with the connection electrode through the contact hole of the over-coating layer, and the second conductive pad is disposed on the first conductive pad;
forming a plurality of first segment electrodes connected with the first line electrode, a plurality of second segment electrodes connected with the second line electrode, and a third conductive pad disposed on the second conductive pad; and
forming a passivation layer covering the first segment electrodes and the second segment electrodes and exposing a part of the third conductive pad,
wherein each of the plurality of first segment electrodes covers both the first line electrode and portions of the over-coating layer adjacent to the first line electrode, and each of the plurality of second segment electrodes covers both the second line electrode and portions of the over-coating layer adjacent to the second line electrode.

12. The method of manufacturing the touch panel according to claim 11, wherein the forming of the over-coating layer includes:
forming an organic layer on the substrate to cover the connection electrode and the first conductive pad;
exposing the organic layer; and
developing the exposed organic layer.

13. The method of manufacturing the touch panel according to claim 11,
wherein the forming of the passivation layer includes:
forming an inorganic layer to cover the first segment electrode, the second segment electrode, and the third conductive pad;
forming a photoresist layer on the inorganic layer;
patterning the photoresist layer;
dry etching the inorganic layer based on a pattern of the patterned photoresist layer; and
removing the pattern of the photoresist layer.

14. A touch panel integrated organic light emitting display device comprising:
a lower substrate;
a thin film transistor disposed on the lower substrate;
an organic light emitting element electrically connected with the thin film transistor;
an upper substrate facing the lower substrate;
a plurality of connection electrodes separated from each other below the upper substrate;
an over-coating layer covering the connection electrodes and including a plurality of contact holes exposing parts of the connection electrodes, respectively;
a first line electrode disposed below the over-coating layer with a first mesh pattern;
a second line electrode electrically separated from the first line electrode, the second line electrode being disposed with a second mesh pattern crossing the first mesh pattern, and the second line electrode being connected with the connection electrodes through the contact holes of the over-coating layer;
a plurality of first segment electrodes electrically connected with the first line electrode; and
a plurality of second segment electrodes electrically connected with the second line electrode,
wherein each of the plurality of first segment electrodes covers both the first line electrode and portions of the over-coating layer adjacent to the first line electrode, and each of the plurality of second segment electrodes covers both the second line electrode and portions of the over-coating layer adjacent to the second line electrode.

15. The touch panel integrated organic light emitting display device according to claim 14, further comprising:
a color filter layer disposed below the upper substrate; and
a black matrix disposed below the color filter layer,
wherein the connection electrode overlaps with the black matrix below the black matrix, and
wherein the first line electrode and the second line electrode overlaps with the black matrix, respectively.

16. The touch panel integrated organic light emitting display device according to claim 14, further comprising:
a polarizer disposed on the upper substrate.

17. The touch panel integrated organic light emitting display device according to claim 14, further comprising:

a plurality of pads disposed below the upper substrate and separately connected with the first line electrode and the second line electrode, respectively, wherein the lower substrate includes a display area in which the organic light emitting element is disposed and a non-display area surrounding the display area, wherein the upper substrate includes a touch area corresponding to the display area of the lower substrate and a peripheral area corresponding to the non-display area of the lower substrate, and wherein the pad is disposed in the peripheral area of the upper substrate.

18. The touch panel integrated organic light emitting display device according to claim 17, further comprising:

a passivation layer covering the first segment electrode and the second segment electrode and exposing a part of the pad.

\* \* \* \* \*